United States Patent

Oishi et al.

[11] Patent Number: 5,993,292
[45] Date of Patent: Nov. 30, 1999

[54] PRODUCTION OF NOTCHLESS WAFER

[75] Inventors: Hiroshi Oishi; Keiichiro Asakawa, both of Annaka, Japan

[73] Assignee: Super Silicon Crystal Research Institute Corp., Japan

[21] Appl. No.: 09/036,944

[22] Filed: Mar. 9, 1998

[30] Foreign Application Priority Data

Mar. 11, 1997 [JP] Japan ..................... 9-055995

[51] Int. Cl.⁶ ........................................... B28B 1/00
[52] U.S. Cl. ................... 451/41; 451/44; 451/54; 451/69; 451/70; 125/13.02
[58] Field of Search ................... 451/41, 44, 54, 451/57, 67, 69, 70; 125/13.02, 13.01

[56] References Cited

U.S. PATENT DOCUMENTS

| | | | |
|---|---|---|---|
| 4,084,354 | 4/1978 | Grandia et al. | 125/13.02 |
| 5,227,339 | 7/1993 | Kishii | 437/225 |
| 5,405,285 | 4/1995 | Hirano et al. | 125/13.02 |
| 5,439,723 | 8/1995 | Miyashita et al. | 428/66.7 |
| 5,679,060 | 10/1997 | Leonard et al. | 451/43 |
| 5,792,566 | 8/1998 | Young et al. | 428/688 |
| 5,927,263 | 7/1999 | Muramatsu | 125/13.01 |

*Primary Examiner*—Eileen P. Morgan
*Attorney, Agent, or Firm*—Webb Ziesenheim Logsdon Orkin & Hanson, P.C.

[57] ABSTRACT

A shallow notch 1 as a tentative mark is engraved on a periphery of an ingot at a position corresponding to a predetermined crystal orientation in the step of grinding the periphery of the ingot. After the ingot is sliced to wafers, a mark 2 for indication of a crystal orientation is carved on a sliced wafer at a position determined on the basis of the notch 1 by laser marking. Thereafter, the wafer is chamfered to a round shape, and the notch 1 is removed by the chamfering. Since a part where the mark 2 shall be carved is determined on the basis of the notch 1, the mark 2 is efficiently carved on the wafer without the necessity of subjecting each wafer to an X-ray analyzer.

2 Claims, 2 Drawing Sheets chamfering

… … …

PRODUCTION OF NOTCHLESS WAFER

BACKGROUND OF THE INVENTION

The present invention relates to a method of producing a round-shape wafer on which a laser mark for indication of a crystal orientation is put instead of a notch or orientation flat.

A wafer sliced off an ingot is processed in various steps such as lapping, chamfering and etching. A mark for indication of a crystal orientation is carved on an edge of the wafer used in these steps. The mark is used for setting the wafer, when the wafer is scribed along a cleavage plane for instance.

Such marks are put on wafers by various methods.

OF method is the most popular one by which an orientation flat is formed at an edge of a wafer. The orientation flat is used for specifying a crystal orientation of the wafer in the subsequent processing steps. However, it is difficult to precisely align a wafer using the orientation, since the orientation flat is formed in a relatively broad area crossing an edge of the wafer at an obtuse angle. Besides, the orientation flat puts restrictions on a shape of an electrostatic chuck used for handling the wafer and causes harmful effects on dynamic balance during spin rotation of the wafer.

A notch engraved on an edge of a wafer is also used as a mark for indication of a crystal orientation. In this case, a notched edge shall be polished to specular glossiness, so as to distinctly detect the notched part during measuring in the subsequent steps. Engravement of the notch likely causes induction of residual stresses at the notched part. Although residual stresses put harmful influences on properties of the wafer, it is difficult to completely remove residual stresses.

Notchless wafers having laser marks for indication of a crystal orientation have been recently used in order to avoid these problems. The laser mark is carved on a front or back side of a wafer by partially melting a surface layer of the wafer with irradiation of a laser beam.

In a conventional laser marking method, each wafer is tested by an X-ray analyzer to detect a crystal orientation of the wafer, and a mark for indication of crystal orientation is put on at a proper position. A commonly used crystal orientation is <110>±1 degree. This method requires a marking operation for each wafer, resulting in poor productivity and heavy duty on the X-ray analyzer.

SUMMARY OF THE INVENTION

The present invention aims at efficient production of a notchless wafer without the necessity of testing each wafer for detecting a crystal orientation.

According to the present invention, a shallow notch extending along an axial direction of an ingot is engraved as a tentative mark for indication of a crystal orientation on a periphery of the ingot at a position corresponding to a predetermined crystal orientation in a step of grinding the periphery of the ingot. After the ingot is sliced to wafers, a mark for indication of the crystal orientation is put on a sliced wafer at a position determined on the basis of the notch. Thereafter, the sliced wafer is chamfered to a round shape, and the notch is removed by the chamfering.

PREFERRED EMBODIMENT OF THE INVENTION

In the newly proposed method, a notch 1 extending along an axial direction of an ingot is engraved on a periphery of the ingot at a position indicating a predetermined crystal orientation, when the ingot is ground at its periphery. The crystal orientation is measured by the same X-ray analyzer as that used for production of a notchless wafer in a conventional method.

Since the notch 1 will be removed in a chamfering step succeeding to carving a mark for indication of a crystal orientation, the notch 1 of 0.2–0.7 mm in depth is engraved on the periphery of the ingot. The notch 1 is as approximately a third shallow as a conventional notch for indication of a crystal orientation, so that the notch 1 can be easily engraved by slight grooving.

After the notch 1 is engraved on the periphery of the ingot, the ingot is sliced to wafers having a predetermined thickness by an inner diameter saw, a wire saw or the like.

Thereafter, a mark 2 for indication of a crystal orientation is carved on the sliced wafer using a hard laser marking device which outputs high energy laser beams. A position to be carved by the laser marking is determined on the basis of the notch 1 without necessity of subjecting every one wafer to an X-ray analyzer as in a conventional method.

The mark 2 for indication of a crystal orientation is carved in such depth that the mark 2 of 10 $\mu$m or deeper will remain in a finished wafer. Such depth of the mark 2 is easily controlled by adjustment of a laser power.

Other marks for indication of specification, identification, production number, user need, etc. may be carved by the same way in addition to the mark 2 for indication of a crystal orientation. These marks may be put on as a bar code at a position apart from the mark 2 for indication of a crystal orientation so as to distinguish them from the mark 2.

In order to automate the laser marking, a position of the notch 1 is detected by a video camera and an image processor, and a part where the mark 2 shall be carved is calculated from the detection result.

Figure 1:
FIG. 1 is a flowchart for explaining the steps of producing a notchless wafer according to the present invention.
Figure 1:
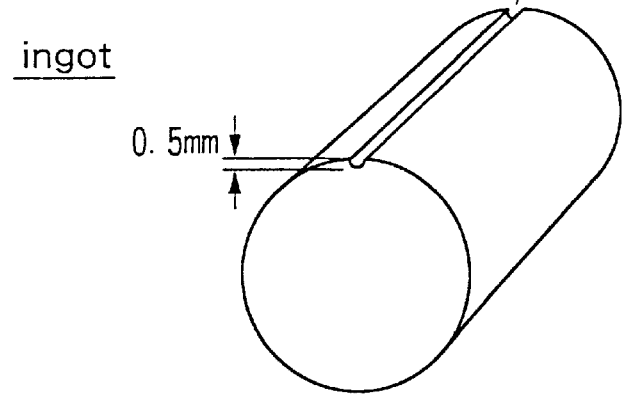
Figure 1:
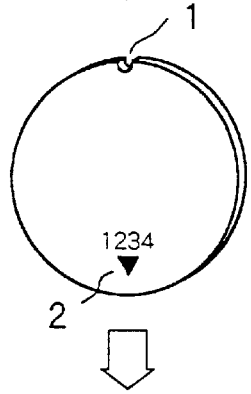
Figure 1:
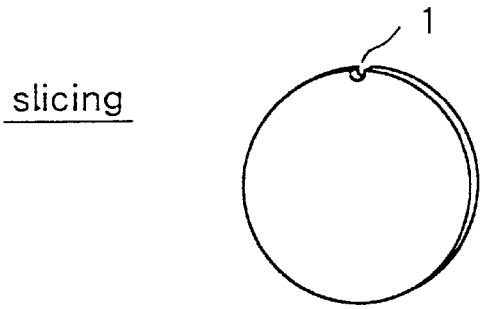
Figure 1:
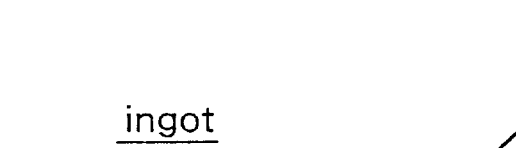
Figure 1:
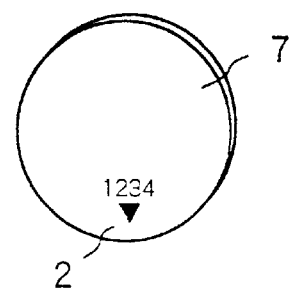
Figure 2:
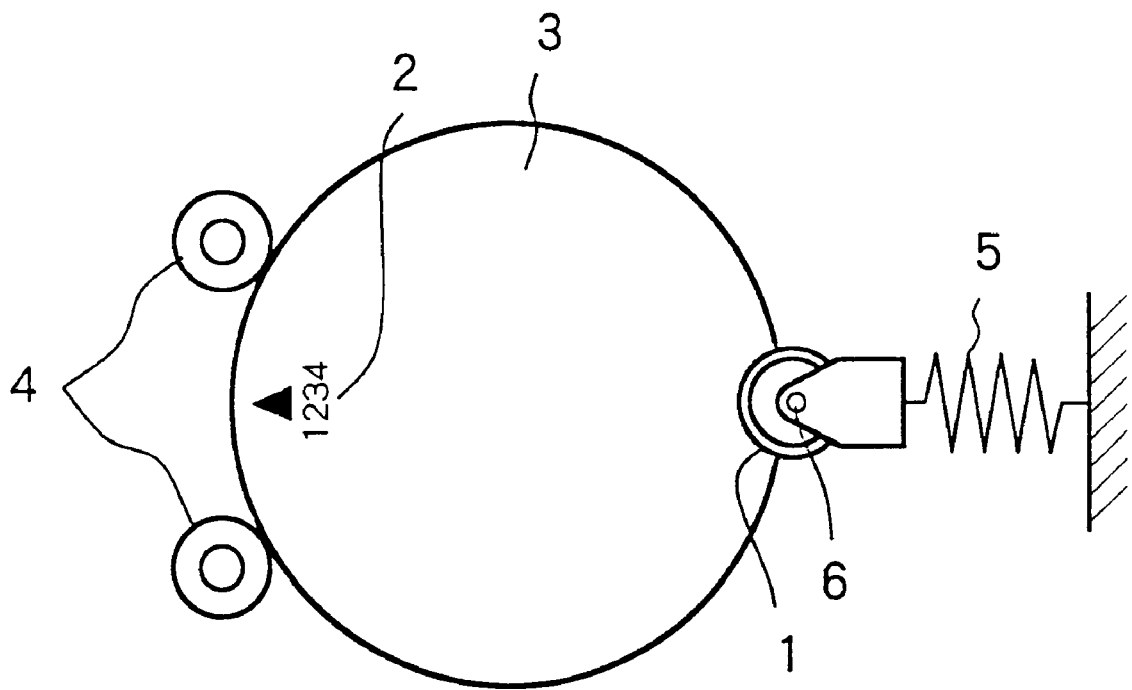
FIG. 2 is a schematic view illustrating a device for manually determining a position for carving a mark for indication of a crystal orientation on a wafer

A device shown in FIG. 2 is used in case of manually determining a position for carving the mark 2. The device has rollers 4 for supporting a wafer 3 at one side. A notch pin 6 is pressed onto the opposite side of the wafer 3 by a spring 5. When the wafer 3 is in-plane rotated, the notch 1 moves along a peripheral direction and accepts the notch pin 6. As a result, the wafer 3 is fixed, and a position where the mark 2 shall be carved is specified.

After the mark 2 is carved on the wafer 3, the wafer 3 is chamfered to a round shape. The notch 1 is removed by the chamfering. Hereon, the notch 1 can be easily removed by slight chamfering, since the notch 1 is shallow compared with a notch engraved as a mark for indication of a crystal orientation in a conventional method.

The round wafer 3 is then lapped, polished and finished to a final product.

As mentioned above, a position where the mark 2 for indication of a crystal orientation shall be carved is determined on the basis of the notch 1, so that the mark 2 is efficiently put on the wafer 3 by laser marking without the necessity of subjecting each wafer to an X-ray analyzer as in a conventional method.

EXAMPLE

When a periphery of an ingot of 200 mm in diameter was ground, a notch 1 of 0.5 mm in depth extending along an axial direction of the ingot was engraved on the periphery of the ingot. The ingot was then sliced to wafers of 0.9 mm in average thickness by a wire saw.

A mark 2 for indication of a crystal orientation was carved at a depth of 0.09 mm on an edge of the wafer 3 at a position opposite to the notch 1 by a hard laser marking device with a laser power of 50 W. The edge of the wafer was then chamfered by 1.2 mm in diameter. The notch 1 was removed by this chamfering, and the wafer 3 was reformed to a round-shape 7 of 200 mm in diameter.

After the round-shape wafer 7 was lapped, polished and finished to a final state, depth of the mark 2 was 0.01 mm. Although the mark 2 became relatively shallower by these processes, the mark 2 of such depth was effective for detection of a crystal orientation.

According to the present invention as aforementioned, a shallow notch is engraved on a periphery of an ingot, the ingot is sliced to wafers, and then a mark for indication of a crystal orientation is carved on the sliced wafer by laser marking. Thereafter, the marked wafer is chamfered to a round shape, and the notch is removed by the chamfering.

Since a position where the mark shall be carved is determined on the basis of the notch, notchless wafers are efficiently produced without the necessity of subjecting each wafer to an X-ray analyzer as in a conventional. The marked wafer obtained in this way has improved handling ability in the subsequent steps due to its round shape.

What is claimed is:

1. A method of producing a notchless wafer, comprising the steps of:

engraving a notch extending along an axial direction of an ingot on a periphery of said ingot at a position corresponding to a predetermined crystal orientation during grinding a periphery of said ingot;

slicing said ingot to wafers;

carving at least one laser mark for indication of a crystal orientation on said wafer at a position determined on the basis of said notch; and chamfering said wafer to a round shape, wherein said notch is engraved to a depth such that said notch is removed by said chamfering.

2. The method according to claim 1, wherein another laser mark for indication of identification of the wafer is carved on an edge of the wafer at a position apart from the laser mark for indication of crystal orientation.

* * * * *